United States Patent
Nakazawa et al.

(10) Patent No.: US 9,548,205 B2
(45) Date of Patent: Jan. 17, 2017

(54) METHOD OF MANUFACTURING A SEMICONDUCTOR DEVICE

(71) Applicant: FUJI ELECTRIC CO., LTD., Kawasaki-shi, Kanagawa (JP)

(72) Inventors: Haruo Nakazawa, Kawasaki (JP); Masaaki Ogino, Kawasaki (JP); Tsunehiro Nakajima, Kawasaki (JP); Kenichi Iguchi, Kawasaki (JP); Masaaki Tachioka, Kawasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/065,851

(22) Filed: Mar. 9, 2016

(65) Prior Publication Data

US 2016/0189968 A1 Jun. 30, 2016

Related U.S. Application Data

(63) Continuation of application No. PCT/JP2014/061088, filed on Apr. 18, 2014.

(51) Int. Cl.
*H01L 21/04* (2006.01)
*H01L 21/285* (2006.01)
(Continued)

(52) U.S. Cl.
CPC ....... *H01L 21/28518* (2013.01); *H01L 21/049* (2013.01); *H01L 21/0485* (2013.01);
(Continued)

(58) Field of Classification Search
None
See application file for complete search history.

(56) References Cited

U.S. PATENT DOCUMENTS

2008/0124922 A1* 5/2008 Kawamura ....... H01L 21/26506
438/664
2010/0155808 A1 6/2010 Makihara et al.
(Continued)

FOREIGN PATENT DOCUMENTS

JP 2002-280548 A 9/2002
JP 2008-135635 A 6/2008
(Continued)

OTHER PUBLICATIONS

Katsunori Makihara et al., "Fabrication of Multiply-Stacked Structures of Si Quantum-Dots Embedded in SiO2 by Combination of Low-pressure CVD and Remote Plasma Treatments", 2004 International Microprocesses and Nanotechnology Conference, Digest of Papers, IEEE, pp. 216-217, Oct. 27-29, 2004.
(Continued)

*Primary Examiner* — Daniel Whalen
(74) *Attorney, Agent, or Firm* — Berdo & Berdo, P.C.

(57) ABSTRACT

A method of manufacturing a semiconductor device that reduces degradation of device properties includes forming an impurity region in a surface layer of a semiconductor substrate by ion injection; forming a transition metal layer in a surface of the impurity region; and exposing the semiconductor substrate with the transition metal layer formed thereon to a hydrogen plasma atmosphere formed by microwaves. The transition metal layer is heated and the heat is transferred from the transition metal layer to the impurity region to form an ohmic contact at the interface of the transition metal layer and the impurity region by reaction of the transition metal layer and the impurity region, and the impurity region is activated. When the substrate is a silicon carbide substrate, the ohmic contact is composed of a transition metal silicide and the impurity region, which is an ion injection layer, is activated.

9 Claims, 6 Drawing Sheets

(51) Int. Cl.
  *H01L 29/66* (2006.01)
  *H01L 29/78* (2006.01)
  *H01L 29/16* (2006.01)

(52) U.S. Cl.
  CPC .... *H01L 21/28568* (2013.01); *H01L 29/1608* (2013.01); *H01L 29/66068* (2013.01); *H01L 29/78* (2013.01)

(56) References Cited

U.S. PATENT DOCUMENTS

| | | | |
|---|---|---|---|
| 2011/0076842 A1* | 3/2011 | Yoshino | H01L 21/2686 438/530 |
| 2012/0326167 A1 | 12/2012 | Tamaso | |
| 2014/0004690 A1 | 1/2014 | Isogai et al. | |
| 2015/0056381 A1 | 2/2015 | Hori et al. | |
| 2016/0126319 A1* | 5/2016 | Ogino | H01L 29/1608 438/586 |
| 2016/0189967 A1* | 6/2016 | Nakazawa | H01L 21/28 438/586 |
| 2016/0189969 A1* | 6/2016 | Iguchi | H01L 29/1608 438/586 |

FOREIGN PATENT DOCUMENTS

| | | |
|---|---|---|
| JP | 2009-177102 A | 8/2009 |
| JP | 2010-040545 A | 2/2010 |
| JP | 2012-069748 A | 4/2012 |
| JP | 2012-099599 A | 5/2012 |
| JP | 2012-186189 A | 9/2012 |
| JP | 2012-246216 A | 12/2012 |
| JP | 2013-178917 A | 9/2013 |
| WO | WO 2009-118783 A1 | 10/2009 |

OTHER PUBLICATIONS

Kiyokazu Nakagawa, "New Heating Method for Polycrystallization of Amorphous Si Using Microwave Plasma Irradiation", ECS Transactions 16(10), The Electrochemical Society, pp. 905-908, Aug. 29, 2008.

Hiroki Nakaie et al., "Formation of Polycrystalline Si Films for Thin-film Transistors by Selective Heating Method of Transition Metal with Hydrogen Radical Irradiation", The 74th Japan Society of Applied Physics Autumn Meeting, 17p-P2-47, 2013.

H. Nakamura et al., "Development of Heating Method of Transition Metal using Hydrogen Plasma (II)", The 59th Japan Society of Applied Physics and Related Societies Spring Meeting, 16a-A6-9, 2012.

* cited by examiner

METHOD OF MANUFACTURING A SEMICONDUCTOR DEVICE

CROSS REFERENCE TO RELATED APPLICATIONS

This non-provisional application is a continuation of International Application PCT/JP2014/061088, filed on Apr. 18, 2014, and designating the U.S., the entire contents of which are incorporated herein by reference.

BACKGROUND OF THE INVENTION

1. Field of the Invention

Embodiments discussed herein are related to a method of manufacturing a semiconductor device.

2. Description of the Related Art

In a semiconductor device (semiconductor apparatus) that uses a silicon (Si) semiconductor, a silicon carbide (SiC) semiconductor, etc., an ohmic contact (electrical contact portion) of a semiconductor portion and a transition metal layer (electrode) is conventionally formed by heat treatment (annealing).

To form such an ohmic contact, a method has been proposed that includes a process of depositing a transition metal layer on a surface of a semiconductor substrate (hereinafter, silicon substrate) formed of a silicon semiconductor, and heat treating the transition metal layer, where the heat treatment is performed at a temperature of 400 degrees C. to 750 degrees C. for 30 seconds to 90 seconds to heat the entire silicon substrate (for example, refer to Japanese Laid-Open Patent Publication No. 2012-246216).

Another method has been proposed where a transition metal layer is vapor deposited at a contact on a silicon carbide substrate and subject to rapid heat treatment at a temperature of 1000 degrees C. for 2 minutes whereby the entire silicon carbide substrate is heated and a carbon-rich silicide electrode is formed (for example, refer to Japanese Laid-Open Patent Publication No. 2009-177102 (paragraph 0017)).

A further method has been proposed where a titanium (Ti) layer, an aluminum (Al) layer, and a silicon layer are sequentially formed on a silicon carbide substrate by sputtering to form a contact electrode, followed by annealing using laser light to form an alloy of the titanium, aluminum, and silicon included in the contact electrode and the silicon and the carbon included in the silicon carbide substrate (for example, refer to Japanese Laid-Open Patent Publication No. 2012-099599 (paragraphs 0042 to 0044)).

Yet another method has been proposed where ion injection is performed to form a source extension region and a drain extension region in a surface of a silicon semiconductor substrate, an absorber film is formed of a metal film and an insulting film that cover the entire source extension region and drain extension region including a gate electrode, and the source extension region and the drain extension region are subject to laser annealing by irradiating laser light on the absorber film (for example, refer to Japanese Laid-Open Patent Publication No. 2002-280548).

Still another method has been proposed that is characterized by including a process of using a gate electrode as a mask and implanting an impurity into a semiconductor layer; a process of forming an interlayer insulating film so as to cover a gate electrode; a process of forming on the interlayer insulating film, a light absorbing film from a metal having a higher melting point than the semiconductor layer; and a process of irradiating the light absorbing film with light and activating the impurity in the semiconductor layer by the heat generated from the light absorbing film absorbing the light (for example, refer to Japanese Laid-Open Patent Publication No. 2010-040545).

Another method has been proposed where an object to be subject to annealing and having an absorption layer formed on a silicon carbide layer and a silicon carbide layer is prepared; the absorption layer of the object is irradiated and caused to generate heat by the energy of the laser beam absorbed by the absorption layer; and the silicon carbide layer is heated by the heat generated by the absorption layer (for example, refer to Japanese Laid-Open Patent Publication No. 2012-069748).

Nonetheless, with Japanese Laid-Open Patent Publication Nos. 2012-246216 and 2009-177102, a portion forming the ohmic contact (i.e., the transition metal layer, an interface of the substrate and the transition metal layer) alone cannot be heated and the entire substrate (the entire device) is uniformly heated. For example, when an ohmic contact of the silicon carbide semiconductor portion and the transition metal layer is formed, as described above, heat treatment is performed at a high temperature of 1000 degrees C. or greater. Therefore, interface properties of the semiconductor portion and gate insulating film and/or the material configuring the device may degrade. In Japanese Laid-Open Patent Publication No. 2012-099599, since a predetermined area is selectively heated by irradiation via a laser for which the spot diameter has been reduced, the described problems occurring with respect to Japanese Laid-Open Patent Publication Nos. 2012-246216 and 2009-177102 can be resolved.

Nonetheless, in Japanese Laid-Open Patent Publication No. 2012-099599, the distance from a lens that converges the laser light, to the surface of the transition metal layer has to be equivalent over the entire surface of the transition metal layer. In other words, device structure has to be such that the device surface is flat without asperity. Therefore, when the distance from the lens that converges the laser light, to the surface of the transition metal layer is not constant such as with disposal of the transition metal layer in a trench side wall, chip side wall, etc., laser irradiation has to be performed according to conditions that correspond to such arrangement and therefore, not all of the transition metal layer can be simultaneously heated and throughput may decrease.

Further, with Japanese Laid-Open Patent Publication No. 2012-099599, since a predetermined region is selectively heated by laser irradiation, programming control of the irradiation locus and the irradiation position of the laser is complicated. Further, consequent to deviations in the position of laser irradiation, uneven irradiation may occur, contact resistivity may deviate, and constituent portions disposed around the transition metal layer (e.g., gate insulating film, etc.) other than the transition metal layer may be heated causing device properties to degrade. When the surface area of the transition metal layer is less than the area corresponding to the spot diameter of the laser, a problem arises in that the transition metal layer alone cannot be selectively heated.

SUMMARY OF THE INVENTION

According to one aspect of the present invention, a method of manufacturing a semiconductor device includes forming an impurity region in a surface layer of a semiconductor substrate by ion injection; forming a transition metal layer in a surface of the impurity region; and exposing the semiconductor substrate with the transition metal layer formed thereon, to a hydrogen plasma atmosphere formed by microwaves. In exposing the semiconductor substrate to the hydrogen plasma atmosphere, by a transfer of heat from the transition metal layer, the impurity region is heated forming at an interface of the transition metal layer and the impurity region, an ohmic contact by a reaction of the transition metal layer and the impurity region, and activating the impurity region.

The method further includes forming a second transition metal layer in a back surface of the semiconductor substrate before exposing the semiconductor substrate to the hydrogen plasma atmosphere. In exposing the semiconductor substrate to the hydrogen plasma atmosphere, the transition metal layer and the second transition metal layer are simultaneously exposed to the hydrogen plasma atmosphere.

The method further includes forming a second transition metal layer in a back surface of the semiconductor substrate before exposing the semiconductor substrate to the hydrogen plasma atmosphere; and disposing a shielding substrate comprising a material other than a transition metal, such that the shielding substrate covers a surface of the second transition metal layer, the shielding substrate being disposed after forming the impurity region and forming the transition metal layer and before exposing the semiconductor substrate to the hydrogen plasma atmosphere. In exposing the semiconductor substrate to the hydrogen plasma atmosphere, the semiconductor substrate having the second transition metal layer covered by the shielding substrate, is exposed to the hydrogen plasma atmosphere.

According to the method, the impurity region is formed from a principal surface of the semiconductor substrate to a side surface; the transition metal layer is formed in a surface of the impurity region, from the principal surface of the semiconductor substrate to the side surface; and in exposing the semiconductor substrate to the hydrogen plasma atmosphere, the impurity region formed from the principal surface of the semiconductor substrate to the side surface is heated by a transfer of heat from the transition metal layer formed from the principal surface of the semiconductor substrate to the side surface.

According to the method, the side surface of the semiconductor substrate is sloped at a predetermined angle with respect to the principal surface of the semiconductor substrate.

The method further includes forming in a surface of the semiconductor substrate before forming the transition metal layer, an insulated gate structure formed by the impurity region comprising a metal oxide film.

The semiconductor substrate may be comprised of silicon carbide. The transition metal layer may be a transition metal in which case the ohmic contact formed at the interface of the transition metal layer and the impurity region by reaction of the transition metal layer and the impurity region is comprised of a silicide.

The other objects, features, and advantages of the present invention are specifically set forth in or will become apparent from the following detailed description of the invention when read in conjunction with the accompanying drawings.

DETAILED DESCRIPTION OF THE INVENTION

Preferred embodiments of a method of manufacturing of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described. When Miller indices are described, "−" means a bar added to an index immediately after the "−", and a negative index is expressed by prefixing "−" to the index.

First Embodiment

Figure 1:
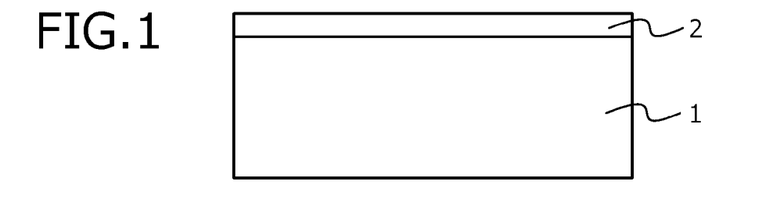
FIG. 1 is a cross-sectional view of a semiconductor device during manufacture according to a first embodiment.
Figure 2:
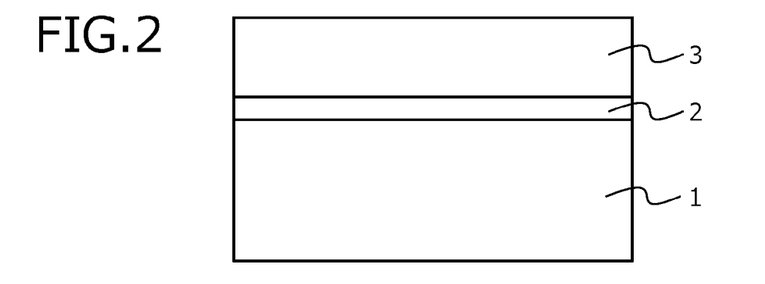
FIG. 2 is a cross-sectional view of the semiconductor device during manufacture according to the first embodiment.

The method of manufacturing a semiconductor device according to a first embodiment will be described taking, as an example, a case where a semiconductor device is produced (manufactured) using a semiconductor substrate (silicon carbide substrate) formed of silicon carbide. FIGS. 1, 2, 3, 4, and 5 are cross-sectional views of a semiconductor device during manufacture according to the first embodiment. As depicted in FIG. 1, for example, a semiconductor region (hereinafter, ion injection region) 2 configuring a predetermined device structure is formed in a silicon carbide substrate (silicon carbide wafer) 1 by ion injection. Here, heat treatment to activate the ion injection region 2 is not performed. Next, as depicted in FIG. 2, for example, a contact electrode 3 is formed in the surface of the ion injection region 2 by a sputtering method, a vapor depositing method, etc.

When the contact electrode 3, for example, is configured by a transition metal, titanium (Ti) or nickel (Ni) having a lower melting point than a tungsten layer 4 may be used; and when configured by a metal other than a transition metal, aluminum (Al) or an alloy including one or more of these metals as a primary component, i.e., the component that is greatest in content by mole fraction, may be used. A transition metal is an element (metal) present within a range from the third element group to the eleventh element group in the periodic table of the elements. When the contact electrode 3 is configured by a transition metal, nickel or titanium is preferably used as the transition metal. The reason for this is that nickel and titanium, compared to other transition metals, have a lower material cost and easily form an ohmic contact (electrical contact portion) with the semiconductor portion and consequently, are of high practical use. Further, the transition metal layer is of a thickness that can ensure that heat is generated to an extent that the interface of the transition metal layer and the silicon carbide substrate 1 can be sufficiently heated; and preferably, the surface of transition metal layer is near (thin) the interface with the silicon carbide substrate to an extent enabling heat transfer to the surroundings resulting from thermal radiation to be prevented, without an occurrence of heat dissipation or insufficient energy required for forming the ohmic contact. More specifically, the thickness of the transition metal layer, for example, is 10 nm or greater and 200 nm or less, and more desirably, 20 nm or greater and 100 nm or less.

Figure 3:
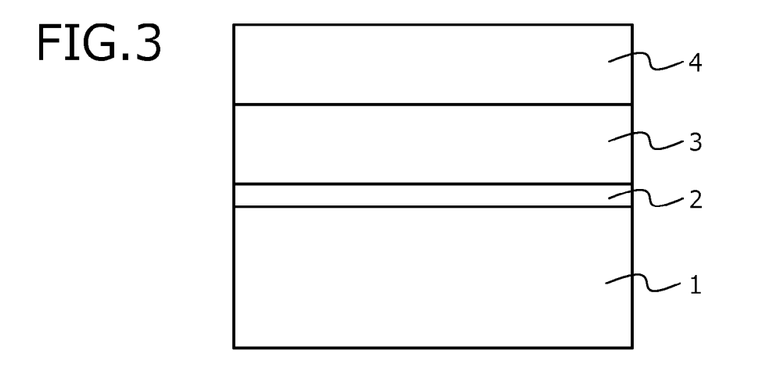
FIG. 3 is a cross-sectional view of the semiconductor device during manufacture according to the first embodiment.
Figure 4:
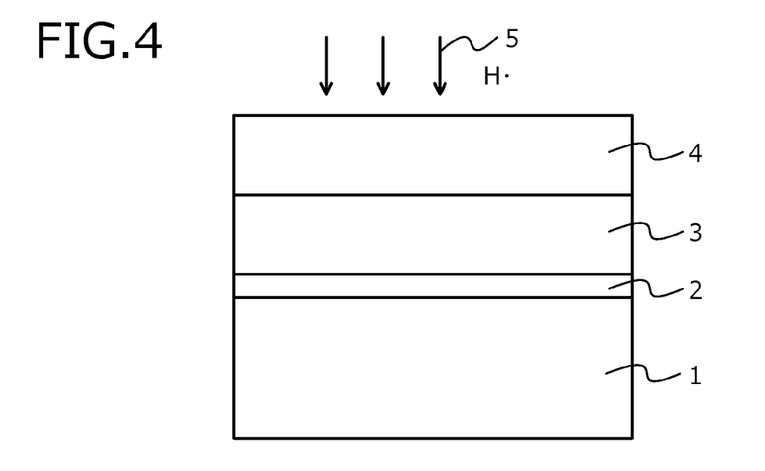
FIG. 4 is a cross-sectional view of the semiconductor device during manufacture according to the first embodiment.

Next, as depicted in FIG. 3, the tungsten layer 4, which contacts the entire surface of the contact electrode 3, is formed on the contact electrode 3. Next, as depicted in FIG. 4, the entire silicon carbide substrate 1 (the entire device including components formed on the substrate) on which the contact electrode 3 and the tungsten layer 4 are sequentially stacked is exposed to a hydrogen plasma atmosphere (plasma processing). As a result, the tungsten layer 4 (when the contact electrode 3 is configured by a transition metal, the contact electrode 3 and the tungsten layer 4) adsorbs hydrogen atoms or hydrogen radicals (H.) 5 (hereinafter, collectively, hydrogen radicals 5) in the hydrogen plasma atmosphere and is heated by the heat generated from the bond energy released when hydrogen molecules are formed. Here, although the entire device surface is exposed to (irradiated with) hydrogen plasma, only the transition metal layer receives the energy from the hydrogen radicals 5 to generate heat. Therefore, constituent portions other than the transition metal layer configuring the device do not generate heat.

Figure 5:
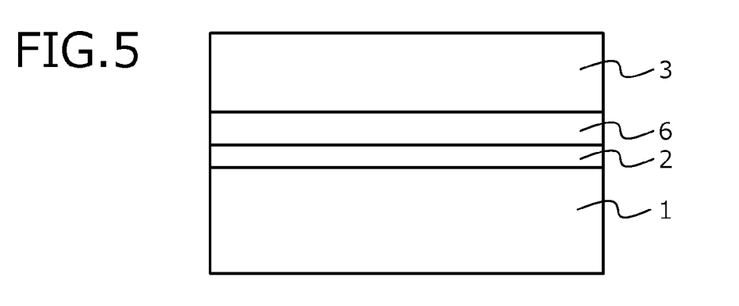
FIG. 5 is a cross-sectional view of the semiconductor device during manufacture according to the first embodiment.

The heat generated by the tungsten layer 4 receiving the energy from the hydrogen radicals 5 is conducted toward a silicon carbide substrate 1 side and heats the contact electrode 3 and the ion injection region 2. When the contact electrode 3 is configured by a transition metal, the heat generated by the energy received from hydrogen radicals being adsorbed to the contact electrode 3 and the tungsten layer is conducted toward the silicon carbide substrate 1 side and heats the ion injection region 2. As a result, as depicted in FIG. 5, at the interface of the contact electrode 3 and the ion injection region 2, a silicide layer 6 forming an ohmic contact with a silicon carbide semiconductor portion (the ion injection region 2) is formed and the ion injection region 2 directly beneath the contact electrode 3 (directly beneath the silicide layer 6) is activated.

The raised temperature of the tungsten layer 4 (or, the contact electrode 3 and the tungsten layer 4) is a temperature that enables formation of an ohmic contact between the ion injection region 2 and the contact electrode 3 and, for example, is 1000 degrees C. or greater. For example, when the contact electrode 3 is configured by a transition metal, the contact electrode 3 itself generates heat and therefore, the heating temperature can be further raised. More specifically, the microwave energy when the hydrogen plasma atmosphere is generated is assumed to be 1000 W or greater and when the contact electrode 3 of nickel is formed, the tungsten layer 4 and the contact electrode 3 generate heat, whereby the heating temperature becomes about 1700 degrees C.

Further, when the contact electrode 3 is configured by a transition metal, as described above, the contact electrode 3 itself generates heat and therefore, the tungsten layer 4 need not be formed. More specifically, the microwave energy when the hydrogen plasma atmosphere is generated is assumed to be 1000 W or greater and when the contact electrode 3 of nickel is formed, the heating temperature becomes about 1100 degrees C. In the present invention, as described above, formation of the silicide layer 6 that becomes the ohmic contact and activation of the ion injection region 2 are performed simultaneously. Therefore, preferably, after formation of the contact electrode 3 from a transition metal, the tungsten layer 4 is formed on the contact electrode 3, whereby the contact electrode 3 and the tungsten layer 4 generate heat that increases the heating temperature, whereby the effect of heating associated with the heat generated by the transition metal layer increases.

The hydrogen plasma used in the plasma processing above, for example, is microwave plasma generated by reducing the pressure of hydrogen ($H_2$) gas of a purity of substantially 100% in a chamber to a predetermined pressure, and using collisional ionization of the gas molecules and electrons accelerated by the electric field of the microwaves. The microwaves, for example, are of a frequency band that can be used in industry and are preferably 1 GHz or greater to enable hydrogen plasma of a high plasma density to be generated, and more preferably, microwaves of a frequency of 2.45 GHz are used. Further, to generate high-density hydrogen plasma, for example, the pressure of the hydrogen gas is preferably lowered to about 10 Pa or more and 100 Pa or less. Hereinafter, the hydrogen plasma atmosphere formed by microwaves will be simply referred to as hydrogen plasma atmosphere.

As a condition of the plasma processing above, for example, the microwave energy when generating the hydrogen plasma atmosphere is preferably 1000 W or greater and the period that the entire silicon carbide substrate is exposed to the hydrogen plasma atmosphere (plasma processing period), for example, is preferably a short period of time on the order of about 400 seconds or less. The reason for this is that when the plasma processing period is long, heat generated by the transition metal layer during the plasma processing is conducted throughout the entire silicon carbide substrate 1 and the entire silicon carbide substrate 1 becomes heated. The temperature rise associated with the heat generated by the transition metal layer becomes highly dependent on the magnitude of the electrical power and the plasma density of the hydrogen plasma. Therefore, the electrical power and the plasma density of the hydrogen plasma suffices to be set such that the transition metal layer receives the energy from the hydrogen radicals 5 and generates heat to a predetermined temperature within a short period of exposure to the hydrogen plasma atmosphere.

In the method of the present invention, the bond energy of hydrogen atoms or hydrogen radicals when forming hydrogen molecules is released directly to the transition metal layer and high density plasma by microwaves is realized, enabling faster heating than by conventional methods. Therefore, the method of the present invention is advantageous in that formation of large masses of carbon the reaction product is suppressed. Further, a portion of the carbon formed by the reaction, in particular, the carbon near the surface reacts with hydrogen is removed as gas such as methane. Therefore, in the silicide layer formed by the method of the present invention has minimal carbon deposition and thus, is advantageous in that the contact resistivity can be lowered and at a subsequent process, adverse effects on adhesion are minimal.

Figure 6:
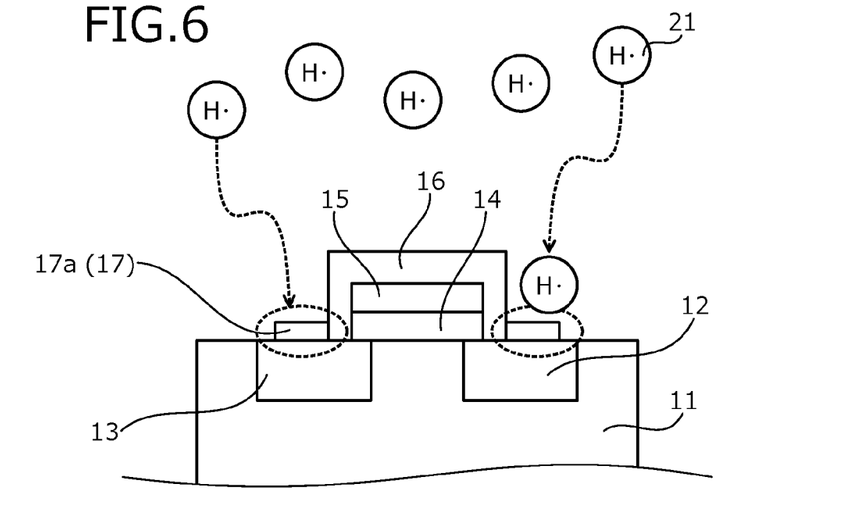
FIG. 6 is a cross-sectional view of a substrate front surface side of the semiconductor device during manufacture according to the first embodiment.

As an example of application of the method of manufacturing a semiconductor device according to the first embodiment described above, a method of manufacturing a metal oxide semiconductor field effect transistor (MOSFET) will be described. FIG. 6 is a cross-sectional view of a substrate front surface side of the semiconductor device during manufacture according to the first embodiment. As depicted in FIG. 6, first, in a front surface side of a silicon carbide substrate becoming a drift region 11, a MOS gate (an insulated gate formed by a metal oxide film semiconductor) structure formed by a source region 12, a drain region 13, a gate insulating film 14, and a gate electrode 15 is formed by a general method.

Next, an interlayer insulating film 16 is formed in the front surface of the silicon carbide substrate. Next, for example, the interlayer insulating film 16 is patterned by photolithography and etching, and a contact hole exposing the source region 12 and a contact hole exposing the drain region 13 are formed, respectively. Next, inside each of the contact holes, for example, a nickel layer 17 that contacts the source region 12 and a nickel layer 17 that contacts the drain region 13 are respectively formed by a sputtering method or vapor deposition method. Further, a tungsten layer (not depicted) may be formed on the nickel layer 17, so as to cover the entire surface of the nickel layer 17. Next, the entire silicon carbide substrate (the entire device) formed by the MOS gate structure and the nickel layer 17 (or, the nickel layer 17 and the tungsten layer) is exposed to the hydrogen plasma atmosphere.

Consequent to being exposed to the hydrogen plasma atmosphere, the nickel layer 17 (or, the nickel layer 17 and the tungsten layer) adsorbs hydrogen radicals 21 in the hydrogen plasma atmosphere and is heated by the heat generated from the bond energy released with the formation of hydrogen molecules. The heat generated by the nickel layer 17 is transferred whereby the drain region 13 and the source region 12 directly below the nickel layer 17 are heated. As a result, a nickel silicide layer 17a forming an ohmic contact with the silicon carbide semiconductor portion (portion encompassed by a dotted ellipse) is formed and, the source region 12 and the drain region 13 are activated. FIG. 6 depicts an example of a case where the entire nickel layer 17 becomes the nickel silicide layer 17a (similarly for FIGS. 7 to 13). Plasma processing conditions, for example, are as follows. Inside a chamber, hydrogen gas of a purity level of substantially 100% is introduced at a flowrate of 10 sccm and after the pressure is reduced to about 25 Pa, microwave energy of 1000 W is supplied, generating microwave plasma. The plasma processing period is 60 to 90 seconds.

Thereafter, in a substrate front surface, for example, an electrode pad (not depicted) of aluminum (Al) is formed so as to be embedded in the contact hole and to contact the nickel silicide layer 17a, whereby a front surface electrode is completed. Thereafter, remaining device structures (not depicted) of the substrate front surface side such as a passivation film, and a back surface electrode, etc. of a substrate back surface side are formed and cutting into chips (dicing) is performed, whereby the MOSFET is completed. Thus, using the heat generated by the nickel layer 17, which is the transition metal layer, the source region 12 and the drain region 13 directly beneath the nickel layer 17 are heated. Materials other than the transition metal do not generate heat and therefore, even if exposed to the hydrogen plasma atmosphere, the interlayer insulating film 16 and the gate insulating film 14 formed by an oxide film ($SiO_2$), the gate electrode 15 formed by polysilicon (poly-Si), etc. are not exposed to excess heat.

Figure 7:
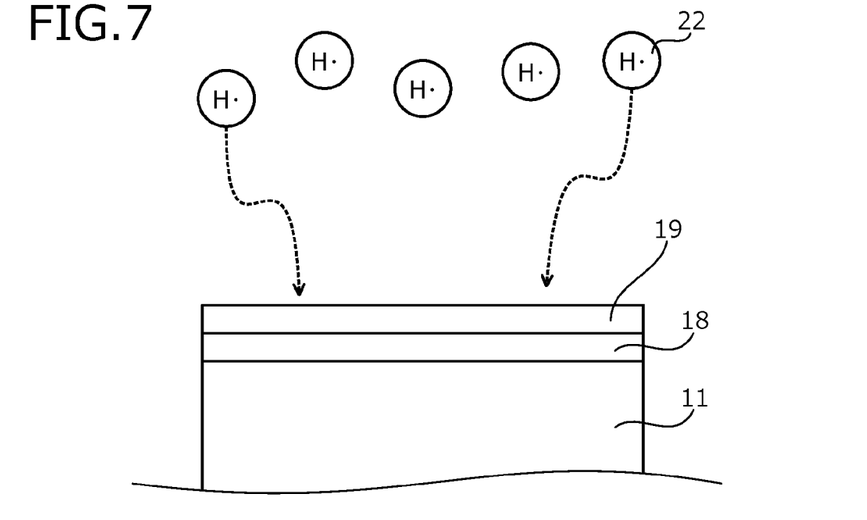
FIG. 7 is a cross-sectional view of a substrate back surface side of the semiconductor device during manufacture according to the first embodiment.
Figure 8:
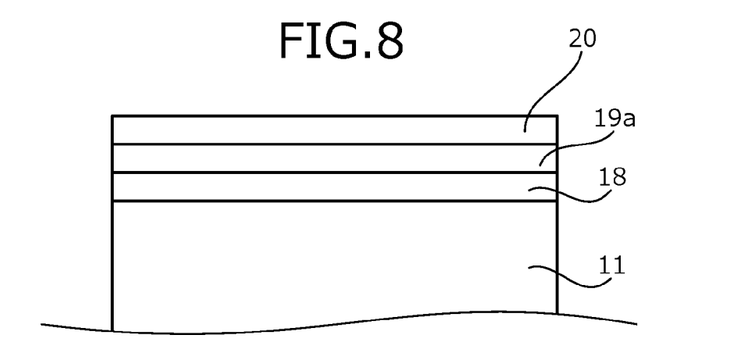
FIG. 8 is a cross-sectional view of the substrate back surface side of the semiconductor device during manufacture according to the first embodiment.

Further, even when an ohmic contact is formed in a back surface of the silicon carbide substrate, similar to the case above where an ohmic contact is formed in the front surface, the transition metal layer alone generates heat, enabling formation of the ohmic contact. More specifically, the ohmic contact is formed in the back surface of the silicon carbide substrate as follows. FIGS. 7 and 8 are cross-sectional views of the substrate back surface side of the semiconductor device during manufacture according to the first embodiment. FIGS. 7 and 8 depict a substrate back surface facing upward and device structures of the substrate front surface side are not depicted (similarly for FIGS. 9 to 11).

As depicted in FIG. 7, for example, an ion injection region 18 is formed by ion injection, in a surface layer of the back surface of the silicon carbide substrate that becomes the drift region 11. Next, a nickel layer 19 is formed on the ion injection region 18 by a sputtering method or vapor deposition method. A tungsten layer (not depicted) may be further formed on the nickel layer 19. Next, the entire silicon carbide substrate (the entire device) formed by the nickel layer 19 (or, the nickel layer 19 and the tungsten layer) is exposed to the hydrogen plasma atmosphere.

By being exposed to the hydrogen plasma atmosphere, the nickel layer 19 (or, the nickel layer 19 and the tungsten layer) adsorbs hydrogen radicals 22 in the hydrogen plasma atmosphere and is heated by the heat generated from the bond energy released with the formation of hydrogen molecules. The heat generated by the nickel layer 19 is transferred whereby the ion injection region 18 directly beneath the nickel layer 19 is heated. As a result, as depicted in FIG. 8, the nickel layer 19 is converted into a silicide, whereby a nickel silicide layer 19a becoming an ohmic contact with the silicon carbide semiconductor portion (the ion injection region 18) is formed and the ion injection region 18 is activated.

Here, even when the MOS gate structure and the interlayer insulating film are formed in the front surface of the silicon carbide substrate side, the MOS gate structure and the interlayer insulating film are configured by a material other than a transition metal and therefore, do not generate heat. Further, the heat generated from the nickel layer 19 increases up to a temperature that enables formation of the ohmic contact in a short period and therefore, a transfer of the heat generated from the nickel layer 19 of the substrate back surface side does not reach the substrate front surface side. Consequently, structures of the substrate front surface side can be prevented from being heated. Plasma processing conditions for forming the nickel silicide layer 19a may be identical to those of the plasma processing for forming the ohmic contact on the substrate front surface.

Next, for example, a metal stacked film 20 of a titanium layer, a nickel layer, and a gold (Au) layer sequentially stacked is formed by a vapor deposition method, in the surface of the nickel silicide layer 19a, whereby the back surface electrode is completed. Since the ohmic contact (the nickel silicide layer 19a) is already formed before the metal stacked film 20 is formed, heat treatment (annealing) for the metal stacked film 20 can be performed at a low temperature that does not adversely affect other constituent portions. Here, although description has been given taking as an example, a case where a transition metal (nickel) is used for the metal of the silicide-formed electrode, when a metal other than a transition metal is used as the material of the electrode, the plasma processing is performed after a tungsten layer is formed on the silicide formed electrode.

As described, according to the first embodiment, the entire device formed by the transition metal layer (the contact electrode, or the contact electrode and the tungsten layer) on the ion injection region is exposed to the hydrogen plasma atmosphere, whereby the transition metal layer adsorbs the hydrogen radicals in the hydrogen plasma atmosphere and is heated by the heat generated from the bond energy released when hydrogen molecules are formed; and the heat generated from the transition metal layer is transferred, whereby the ion injection region directly beneath the silicide layer is heated. As a result, a silicide layer of low contact resistivity can be formed to become the ohmic contact and the ion injection region can be activated. Therefore, a heat treating process solely for activating the ion injection region becomes unnecessary, enabling simplification of manufacturing processes and improved throughput. Further, according to the first embodiment, when the entire device is exposed to the hydrogen plasma atmosphere, since constituent portions other than the transition metal layer do not generate heat, for example, excess heat is not applied near the gate insulating film of the MOS gate structure. Therefore, interface properties of the gate insulating film and the silicon carbide semiconductor portion can be prevented from degrading and device properties can be prevented from degrading.

Further, according to the first embodiment, since the ohmic contact is formed and the ion injection region can be activated by the heat generated by the transition metal layer, irrespective of the presence/absence of unevenness of the device surface and patterning, the transition metal layer exposed at the wafer surface and the ion injection region beneath the transition metal layer alone can be selectively heated. As a result, the throughput can be improved. Further, according to the first embodiment, since the transition metal layer alone can be controlled to generate heat and be heated, contact resistivity deviations, unintended heating of constituent portion (e.g., gate insulating film, etc.), and degradation of device properties can be suppressed without needing complicated programming such as for laser annealing. Further, the minimum area that can be heated is a limiting factor for patterning techniques of transition metal layers by photolithography, according to the first embodiment, a region of a smaller surface area than the area corresponding to the spot diameter of the laser can be heated.

Second Embodiment

Figure 9:
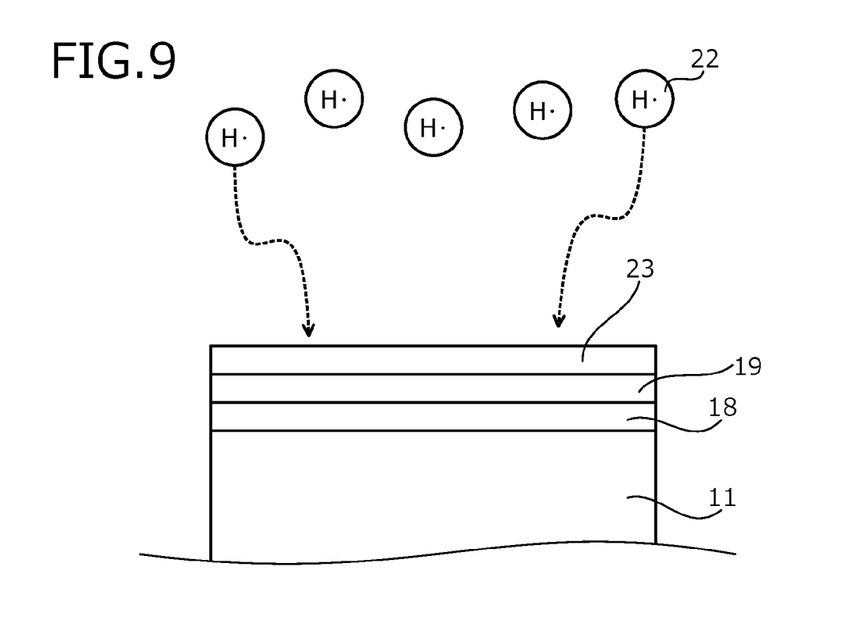
FIG. 9 is a cross-sectional view of a substrate back surface side during manufacture according to a second embodiment.
Figure 10:
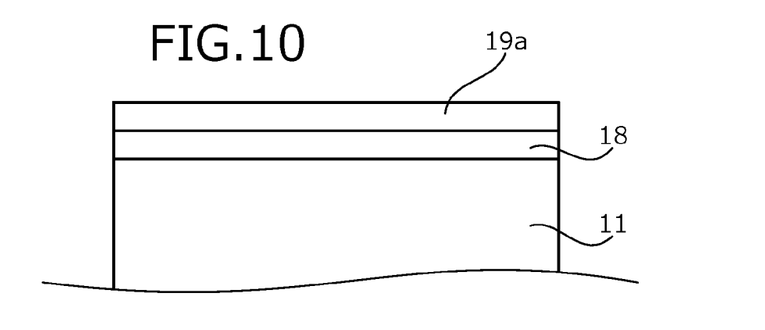
FIG. 10 is a cross-sectional view of the substrate back surface side during manufacture according to the second embodiment.
Figure 11:
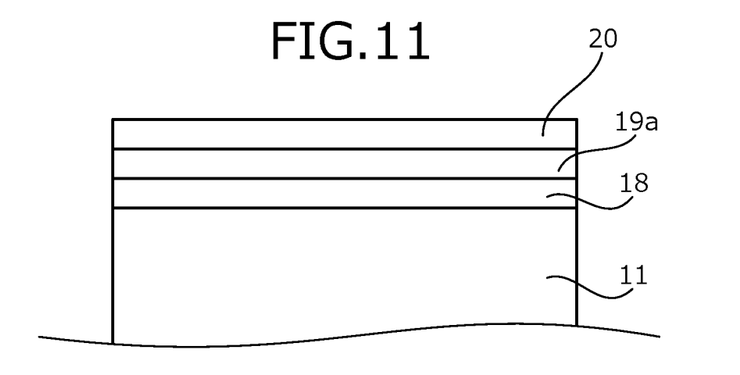
FIG. 11 is a cross-sectional view of the substrate back surface side during manufacture according to the second embodiment.

The method of manufacturing a semiconductor device according to a second embodiment will be described taking as an example, a case where an ohmic contact is formed in the back surface of the silicon carbide substrate. FIGS. 9, 10, and 11 are cross-sectional views of the substrate back surface side during manufacture according to the second embodiment. The method of manufacturing a semiconductor device according to the second embodiment differs from the method of manufacturing a semiconductor device according to the first embodiment in that, in place of the tungsten layer, a titanium layer 23 is formed on the transition metal layer (e.g., the nickel layer 19) that is converted to a silicide and thereafter, the entire silicon carbide substrate (the entire device) is exposed to the hydrogen plasma atmosphere. The titanium layer 23 has a function of suppressing adverse effects of carbon (C) in the silicon carbide semiconductor portion, on the nickel silicide layer 19a formed by a reaction of the nickel layer 19 and the ion injection region 18.

More specifically, as depicted in FIG. 9, similar to the first embodiment, in the back surface side of the silicon carbide substrate, the ion injection region 18 and the nickel layer 19 are formed. Next, on the nickel layer 19, the titanium layer 23 is formed so as to cover the entire surface of the nickel layer 19. Next, the entire silicon carbide substrate having the nickel layer 19 and the titanium layer 23 sequentially stacked thereon is exposed to the hydrogen plasma atmosphere. By being exposed to the hydrogen plasma atmosphere, the titanium layer 23, which is the most superficial layer, adsorbs the hydrogen radicals 22 in the hydrogen plasma atmosphere and is heated by the heat generated from the bond energy released when hydrogen molecules are formed. The heat generated from the titanium layer 23 is transferred, whereby the nickel layer 19 and the ion injection region 18 directly beneath the titanium layer 23 are heated. Since the surface of the nickel layer 19 is entirely covered by the titanium layer 23, the heat generated from the titanium layer 23 is uniformly transferred to provide uniform heating. As a result, as depicted in FIG. 10, the nickel layer 19 is converted into a silicide to form the nickel silicide layer 19a and the ion injection region 18 is activated.

The thickness of the titanium layer 23 is thinner than that of the nickel layer 19 and, for example, may be 10 nm or greater and 100 nm or less. Ideally, the thickness of the titanium layer 23 is preferably 30 nm or greater. The reason for this is that during exposure to the hydrogen plasma atmosphere, an effect of shielding hydrogen radicals can be increased. The shielding of the hydrogen radicals by the titanium layer 23 suppresses the reaction of hydrogen radicals adsorbed by the nickel layer 19 to form hydrogen molecules, enabling the nickel layer 19 to be uniformly heated by the transfer of the heat generated from the titanium layer 23 that covers the entire surface of the nickel layer 19.

Further, the nickel layer 19 agglomerates or vaporizes consequent to melting from heating and therefore, when silicidized to become the nickel silicide layer 19a, cracks, intermittent voids, etc. may occur. On the other hand, the titanium layer 23 having a melting point that is higher than that of the nickel layer 19 remains without melting and functions as a cap layer covering the entire surface of the nickel layer 19. Therefore, by covering the surface of the nickel layer 19 by the titanium layer 23, cracks, intermittent voids, etc. can be prevented from occurring in the nickel silicide layer 19a. In other words, by covering the surface of the nickel layer 19 by the titanium layer 23, the nickel layer 19 is uniformly heated and agglomeration and vaporization of the nickel layer 19 can be controlled. In cases where in place of the titanium layer 23, a tungsten layer is formed as in the first embodiment, the effect of a cap layer can be similarly obtained.

Further, when the nickel silicide layer 19a is formed, excess carbon atoms that result from silicon atoms inside the silicon carbide semiconductor portion bonding with the nickel layer 19 bond with the titanium atoms inside the titanium layer 23. Therefore, deposition and agglomeration of carbon inside the nickel silicide layer 19a can be prevented. After the plasma processing, the titanium layer 23 may not be in a favorable state as an electrode layer and may cause peeling and degradation of electrical properties (reduced contact resistivity) of the back surface electrode. Therefore, after the plasma processing, the titanium layer 23 is removed. As depicted in FIG. 11, similar to the first embodiment, in the surface of the nickel silicide layer 19a, the metal stacked film 20 of a titanium layer, a nickel layer, and a metal layer sequentially stacked is formed, whereby the back surface electrode is completed.

In the method of manufacturing a semiconductor device according to the second embodiment, a principal surface of the silicon carbide substrate in which the ohmic contact is formed, for example, may be a (000-1)C face of four layer periodic hexagonal (4H—SiC) silicon carbide, or may be a (0001)Si face. Compared to crystal faces having other plane orientations, carbon deposits easily in the (000-1)C face and therefore, the ohmic contact (the nickel silicide layer 19a) formed in the (000-1)C face is more susceptible to the adverse effects of carbon. Consequently, an effect of suppressing the adverse effects of carbon atoms inside the silicon carbide substrate appears most strikingly in the case of formation of the nickel silicide layer 19a in the (000-1)C face.

Further, the titanium layer 23 alone may be formed in the back surface of the silicon carbide substrate, without forming the nickel layer 19. In this case, the titanium layer 23 adsorbs the hydrogen radicals 22 in the hydrogen plasma atmosphere, is heated by the heat generated from the bond energy released with the formation of hydrogen molecules, and a titanium silicide layer is formed that becomes the ohmic contact with the silicon carbide substrate. Since titanium reacts with both silicon and carbon, when a titanium layer is used, the agglomeration of excess carbon atoms is curbed, enabling the adverse effects of excess carbon atoms to be suppressed to a greater extent than when the nickel silicide layer 19a, which is formed from the nickel layer 19, is formed. On the other hand, the nickel silicide layer 19a formed from the nickel layer 19 can reduce the contact resistivity to a greater extent than the titanium silicide layer formed from the titanium layer 23. Therefore, the transition metal layer that is to form the silicide layer is preferably selected according to design conditions.

As described, according to the second embodiment, effects similar to those of the first embodiment can be obtained.

Third Embodiment

Figure 12:
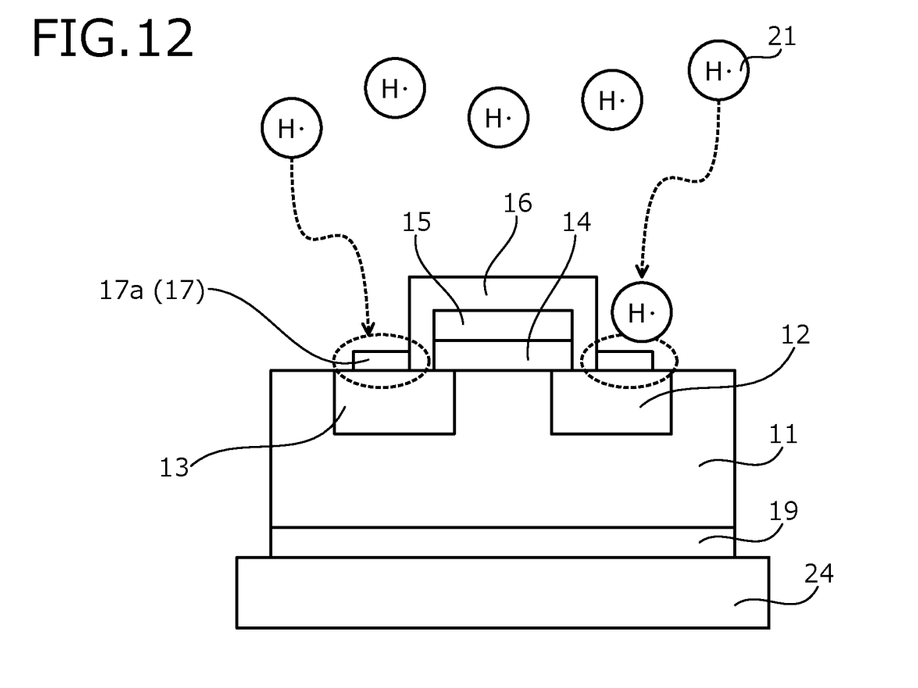
FIG. 12 is a cross-sectional view of a semiconductor device during manufacture according to a third embodiment.

The method of manufacturing a semiconductor device according to a third embodiment will be described taking as an example, a case where a MOSFET is formed. FIG. 12 is a cross-sectional view of a semiconductor device during manufacture according to the third embodiment. The method of manufacturing a semiconductor device according to the third embodiment differs from the method of manufacturing a semiconductor device according to the first embodiment in that with the nickel layers 17, 19 formed on both surfaces of the silicon carbide substrate, a quartz substrate 24 is disposed so as to contact the entire surface of the nickel layer 19 of the substrate back surface side and the entire silicon carbide substrate (the entire device) is exposed to the hydrogen plasma atmosphere.

More specifically, as depicted in FIG. 12, similar to the first embodiment, processes up to and including those of forming the nickel layers 17, 19 in the surfaces of the silicon carbide substrate respectively are performed. Next, the quartz substrate 24 is disposed so as to contact the entire surface of the nickel layer 19 of the substrate back surface side. Next, with the quartz substrate 24 disposed so as to contact the entire surface of the nickel layer 19, the entire silicon carbide substrate is exposed to the hydrogen plasma atmosphere. Since hydrogen radicals 21 are shielded by the quartz substrate 24 and do not reach the nickel layer 19 of the substrate back surface side, the nickel layer 19 of the substrate back surface side does not generate heat.

On the other hand, the nickel layer 17 of the substrate front surface side is exposed to the hydrogen plasma atmosphere and therefore, adsorbs the hydrogen radicals 21 in the hydrogen plasma atmosphere and is heated by the heat generated from the bond energy released when hydrogen molecules are formed. Therefore, for example, in a case where the back surface electrode is already completed in the processes up to the plasma processing for forming the ohmic contact in the substrate front surface side, the nickel layer 17 of the substrate front surface side alone can be caused to generate heat and be heated, without the nickel layer 19 of the substrate back surface side being affected by the hydrogen radicals 21.

In other words, by this plasma processing, the nickel silicide layer 17a alone is formed in the substrate front surface side and, the source region 12 and the drain region 13 are activated. Thereafter, similar to the first embodiment, an electrode pad (not depicted) of aluminum, etc. is formed, completing the front surface electrode. In place of the quartz substrate 24, a silicon substrate or a metal substrate that is formed by a metal other than a transition metal and that does not generate heat consequent to the hydrogen radicals 21 may be used. Preferably, the quartz substrate 24 is used from the viewpoint of preventing foreign particles from adhering to the nickel layer 19.

As described, according to the third embodiment, effects identical to those of the first embodiment can be obtained.

Fourth Embodiment

Figure 13:
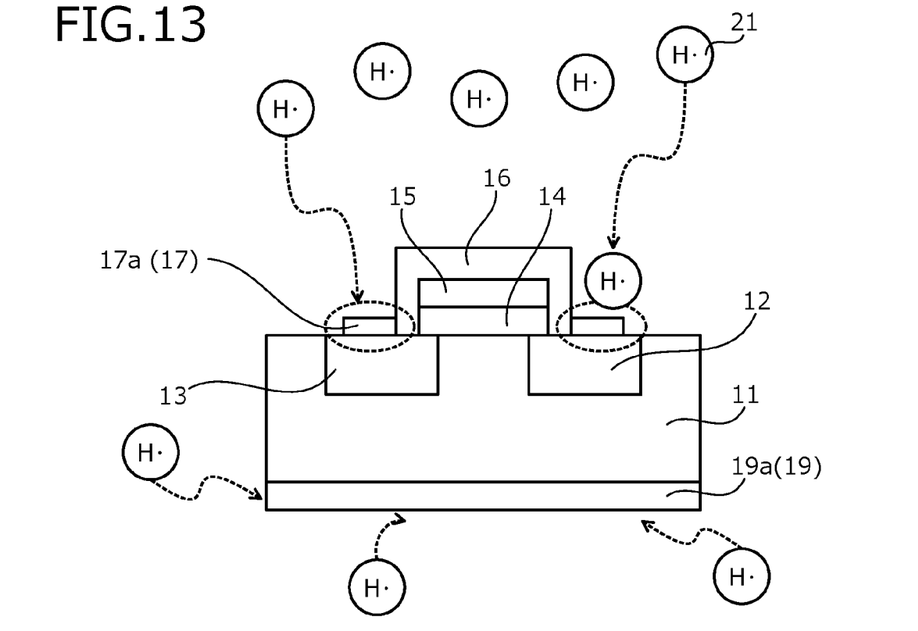
FIG. 13 is a cross-sectional view of a semiconductor device during manufacture according to a fourth embodiment.

The method of manufacturing a semiconductor device according to a fourth embodiment will be described taking as an example, a case where a MOSFET is formed. FIG. 13 is a cross-sectional view of a semiconductor device during manufacture according to the fourth embodiment. The method of manufacturing a semiconductor device according to the fourth embodiment differs from the method of manufacturing a semiconductor device according to the third embodiment in that the nickel layers 17, 19 formed on both sides of silicon carbide substrate are simultaneously exposed to the hydrogen plasma atmosphere. On other words, the nickel layer 19 of the substrate back surface side is not covered by a quartz substrate.

More specifically, for example, with the nickel layers 17, 19 formed, the silicon carbide wafer is housed in a wafer cassette (not depicted) equipped with slits and is exposed to the hydrogen plasma atmosphere. The nickel layers 17, 19 formed in both substrate surfaces are simultaneously exposed to the hydrogen plasma atmosphere, whereby both of the nickel layers 17, 19 can be simultaneously caused to generate heat and be heated. As a result, on both substrate sides, the nickel silicide layers 17a, 19a can be formed respectively and, the source region 12 and the drain region 13 directly beneath the nickel silicide layer 17a can be activated. Since plasma processing for the ohmic contacts on both substrate sides can be performed by a single process, the manufacturing processes can be simplified.

As described, according to the fourth embodiment, effects identical to those of the first embodiment can be obtained.

Fifth Embodiment

Figure 14:
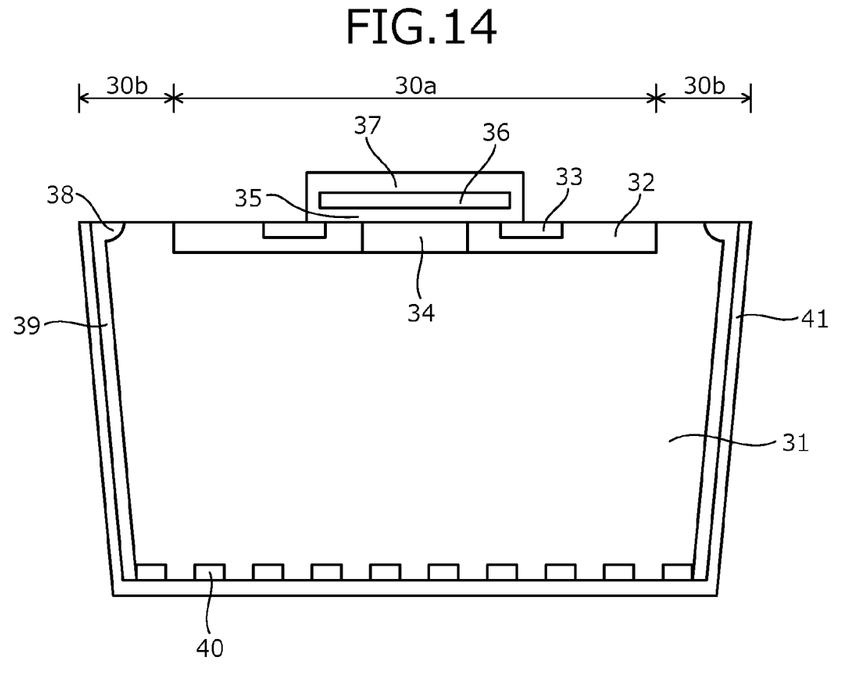
FIG. 14 is a cross-sectional view of a semiconductor device that can be manufactured by the method of manufacturing a semiconductor device according to a fifth embodiment.
Figure 15:
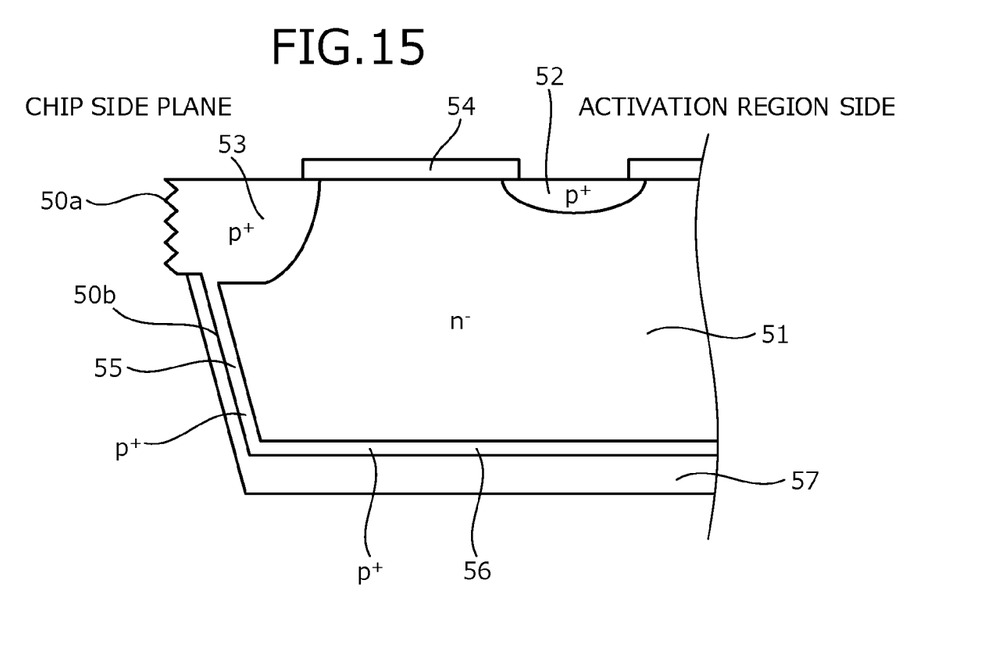
FIG. 15 is a cross-sectional view of another semiconductor device that can be manufactured by the method of manufacturing a semiconductor device according to the fifth embodiment.

An example of a semiconductor device produced (manufactured) by an application of the method of manufacturing a semiconductor device according to the present invention will be described. FIG. 14 is a cross-sectional view of a semiconductor device that can be manufactured by the method of manufacturing a semiconductor device according to a fifth embodiment. FIG. 15 is a cross-sectional view of another semiconductor device that can be manufactured by the method of manufacturing a semiconductor device according to the fifth embodiment. By applying the method of manufacturing of a semiconductor device according to the first to the fourth embodiments above, a reverse blocking MOSFET (RB-MOSFET) depicted in FIG. 14 can be produced with high precision. A structure of the reverse blocking MOSFET will be described.

As depicted in FIG. 14, a silicon carbide substrate (semiconductor chip) that forms an $n^-$-type drift region 31, for example, has a tapered cross sectional shape such that from the back surface toward the front surface, a chip side surface is sloped such that a chip width becomes widened. In an activation region 30a, a MOS gate structure formed by a p-type base region 32, an $n^+$-type source region 33, an $n^-$-type contact region 34, a gate insulating film 35, and a gate electrode 36 is disposed in the front surface of the silicon carbide substrate side. A non-depicted source electrode contacts the p-type base region 32 and the $n^+$-type source region 33, and is electrically insulated from the gate electrode 36 by an interlayer insulating film 37. The activation region 30a is a region in which current flows in an ON state.

In an edge termination structure portion 30b surrounding the activation region 30a, a $p^+$-type stopper region 38 is disposed in a surface layer of the front surface of the silicon carbide substrate so as to be exposed at the chip side surface. Further, in the chip side surface, a $p^-$-type region 39 is disposed so as to reach the front surface (source side) from the substrate back surface (drain side). The edge termination structure portion 30b is a region that relaxes the electric field of the substrate front surface side of the $n^-$-type drift region 31 and maintains the breakdown voltage. Further, $p^-$-type regions 40 are selectively disposed in a surface layer of the back surface of the silicon carbide substrate, from the activation region 30a to the edge termination structure portion 30b. The $p^-$-type regions 40 have a function of reducing leak current.

The $p^-$-type region 40 disposed farthest on the chip side surface side is connected to the $p^+$-type stopper region 38 by the $p^-$-type region 39 of the chip side surface. The $p^-$-type region 39 of the chip side surface and the $p^-$-type region 40 of the chip back surface, for example, are an ion injection region formed by ion injection. A back surface electrode 41 is disposed from a chip back surface to the chip side surface and is connected to the $p^-$-type regions 39, 40. In the method of manufacturing a semiconductor device according to the present invention, by sloping the chip side surface with respect to the chip back surface, even for a semiconductor device in which unevenness occurs in the device surface, an ohmic contact can be formed without contact resistivity deviation from the chip side surface to the chip back surface and the ion injection region can be activated.

In other words, for example, the back surface electrode 41 is configured by a transition metal or a tungsten layer (not depicted) is formed in the entire surface of the back surface electrode 41. Thereafter, with the $p^-$-type regions 39, 40 and the back surface electrode 41 formed thereon, the silicon carbide substrate is exposed to the hydrogen plasma atmosphere. As a result, the back surface electrode 41 adsorbs hydrogen radicals in the hydrogen plasma atmosphere and is heated by the heat generated from the bond energy released when hydrogen molecules form; and by a transfer of heat from the back surface electrode 41, the $p^-$-type region 39 of the chip side surface and the $p^-$-type region 40 of the chip back surface are simultaneously heated. As a result, an ohmic contact of the back surface electrode 41 can be formed from the chip side surface to the chip back surface without deviation in the contact resistivity and, the $p^-$-type region 39 of the chip side surface and the $p^-$-type region 40 of the chip back surface can be simultaneously activated.

By applying the method of manufacturing a semiconductor device according to the first to the fourth embodiments, a reverse blocking insulated gate bipolar transistor (RB-IGBT) depicted in FIG. 15 can be produced with high precision. In a front surface side of a silicon carbide substrate (semiconductor chip) that forms an $n^-$-type drift region 51, a MOS gate structure formed by a p-type base region, an $n^+$-type emitter region, a $p^+$-type contact region, a gate insulating film, and a gate electrode is disposed in a non-depicted activation region.

Further, in an edge termination structure portion surrounding the activation region, floating $p^+$-type regions (field limiting ring) 52 are disposed in the surface layer of the front surface of the silicon carbide substrate to surround the activation region. Further, in the surface layer of the front surface of the silicon carbide substrate, a $p^+$-type stopper region 53 is disposed so as to be exposed at a cutting plane (the chip side surface) 50a at a dicing line. Reference numeral 54 represents an interlayer insulating film. In the back surface of the silicon carbide substrate, a trench 50b is disposed that, in a direction of depth, penetrates the $n^-$-type drift region 51 to reach the $p^+$-type stopper region 53. A $p^+$-type region 55 is disposed so as to be exposed at a side wall of the trench 50b.

In the surface layer of the back surface of the silicon carbide substrate, a $p^+$-type collector region 56 is disposed from the activation region 30a to the edge termination structure portion 30b. The $p^+$-type collector region 56 is connected to the $p^+$-type stopper region 53 by the $p^+$-type region 55 of the side wall of the trench 50b. The $p^+$-type region 55 and the $p^+$-type collector region 56, for example, are an ion injection region formed by ion injection. A collector electrode 57 is disposed from the chip back surface to the trench side wall and contacts the $p^+$-type region 55 and the $p^+$-type collector region 56. In the method of manufacturing of a semiconductor device according to the present invention, by sloping the side wall of the trench 50b with respect to the chip back surface, even for a semiconductor device in which unevenness occurs in the device surface, the side wall of the trench 50b can form an ohmic contact without contact resistivity deviation across the chip back surface and the ion injection region can be activated.

In other words, for example, the collector electrode 57 is configured by a transition metal or a tungsten layer (not depicted) is formed in the entire surface of the collector electrode 57. Thereafter, with the $p^+$-type region 55, the p+-type collector region 56, and the collector electrode 57 formed thereon, the silicon carbide substrate is exposed to the hydrogen plasma atmosphere. As a result, the collector electrode 57 adsorbs the hydrogen radicals in the hydrogen plasma atmosphere and is heated by the heat generated from the bond energy released when hydrogen molecules form; and by a transfer of heat from the collector electrode 57, the p+-type region 55 of the trench side wall and the p+-type collector region 56 of the chip back surface are simultaneously heated. As a result, an ohmic contact of the collector electrode 57 can be formed from the trench side wall to the chip back surface without contact resistivity deviation and, the p+-type region 55 of the trench side wall and the p+-type collector region 56 of the chip back surface can be simultaneously activated.

As described, according to the fifth embodiment, effects identical to those of the first to the fourth embodiments can be obtained.

The present invention is not limited to the above embodiments and various changes can be made thereto within a scope that does not depart from the spirit of the present invention. Further, in the embodiments above, although description is given using a silicon carbide substrate as an example, identical effects are achieved for a semiconductor substrate (silicon substrate) that uses silicon. In the case of a silicon substrate, the temperature of the heat generated from the bond energy when hydrogen radicals are adsorbed and hydrogen molecules are formed is set based on the state of silicon substrate, the melting point of the transition metal layer, etc. Further, in the embodiments, although description is given using a semiconductor device having a MOS gate structure, the method is not limited hereto and for example, is applicable to a semiconductor device having a device structure such as an insulating film or semiconductor portion for which device properties are at risk of changing consequent to heating.

According to the invention described above, transition metal is heated by bond energy released when hydrogen radicals adsorbed by the transition metal layer form molecules and by a transfer of heat from the transition metal layer, a portion of silicon carbide substrate contacting the transition metal layer is heated. As a result, a metal silicide layer is formed becoming an ohmic contact with the silicon carbide substrate. Further, constituent portions other than the transition metal layer do not generate heat such as, for example, a vicinity near the gate insulating film of the MOS gate structure. Therefore, interface properties of the gate insulating film and the silicon carbide semiconductor portion can be prevented from degrading. Together with the formation of the metal silicide layer, the ion injection layer beneath the metal silicide layer can be activated by a transfer of heat from the transition metal layer. Thus, a heat treating process solely for activating the ion injection region becomes unnecessary, enabling manufacturing processes to be simplified.

According to the method of manufacturing a semiconductor device of the present invention, an effect can be achieved in that an ohmic contact of low contact resistivity can be formed and degradation of device characteristics can be prevented. Further, according to the method of manufacturing of a semiconductor device of the present invention, an effect is achieved in that throughput can be improved.

As described, the method of manufacturing a semiconductor device according to the present invention is particularly suitable for power semiconductor devices used in a semiconductor device that uses a silicon carbide semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, comprising:
    forming an impurity region in a surface layer of a semiconductor substrate by ion injection;
    forming a transition metal layer in a surface of the impurity region, with an interface therebetween; and
    exposing the semiconductor substrate having the transition metal layer formed thereon to a hydrogen plasma atmosphere for a predetermined period, the hydrogen plasma atmosphere formed to have a predetermine plasma density by microwaves having a predetermined electric energy so as to heat only the transition metal layer to a predetermined temperature, and to transfer the heat from the transition metal layer to the impurity region and form an ohmic contact at the interface of the transition metal layer and the impurity region by reaction of the transition metal layer and the impurity region, and activate the impurity region.

2. The method according to claim 1, further comprising forming a second transition metal layer in a back surface of the semiconductor substrate before exposing the semiconductor substrate to the hydrogen plasma atmosphere, and wherein, during exposing the semiconductor substrate to the hydrogen plasma atmosphere, the transition metal layer and the second transition metal layer are simultaneously exposed to the hydrogen plasma atmosphere.

3. The method according to claim 1, further comprising:
    forming a second transition metal layer in a back surface of the semiconductor substrate before exposing the semiconductor substrate to the hydrogen plasma atmosphere; and
    disposing a shielding substrate comprising a material other than a transition metal, such that the shielding substrate covers a surface of the second transition metal layer, the shielding substrate being disposed after forming the impurity region and forming the transition metal layer and before exposing the semiconductor substrate to the hydrogen plasma atmosphere, and
    wherein, during exposing the semiconductor substrate to the hydrogen plasma atmosphere, the semiconductor substrate having the second transition metal layer covered by the shielding substrate, is exposed to the hydrogen plasma atmosphere.

4. The method according to claim 1, wherein the semiconductor substrate has a principal surface and a side surface, the impurity region is formed from the principal surface to the side surface, the transition metal layer is formed in a surface of the impurity region from the principal surface to the side surface, and, during exposing the semiconductor substrate to the hydrogen plasma atmosphere, the impurity region formed from the principal surface to the side surface is heated by a transfer of heat from the transition metal layer.

5. The method according to claim 4, wherein the side surface of the semiconductor substrate is sloped at a predetermined angle with respect to the principal surface of the semiconductor substrate.

6. The method according to claim 1, further comprising forming in a surface of the semiconductor substrate, before forming the transition metal layer, an insulated gate structure formed by the impurity region which comprises a metal oxide film.

7. The method according to claim 1, wherein during the exposing the semiconductor substrate having the transition metal layer formed thereon to the hydrogen plasma, hydrogen gas is injected into a chamber holding the semiconductor substrate so as to maintain a range from 10 Pa to 100 Pa while microwave energy equal to or greater than 1000 W is supplied.

8. The method according to claim 1, wherein the transition metal layer has a thickness in the range 10 nm to 200 nm.

9. The method according to claim 8, wherein the transition metal layer has a thickness in the range 20 nm to 100 nm.

* * * * *

UNITED STATES PATENT AND TRADEMARK OFFICE
CERTIFICATE OF CORRECTION

PATENT NO. : 9,548,205 B2  
APPLICATION NO. : 15/065851  
DATED : January 17, 2017  
INVENTOR(S) : Haruo Nakazawa et al.

Page 1 of 1

It is certified that error appears in the above-identified patent and that said Letters Patent is hereby corrected as shown below:

On the Title Page

Item (74) (Attorney, Agent or Firm):
"Berdo & Berdo, P.C." should be changed to --Rabin & Berdo, P.C.--

Signed and Sealed this
Twenty-first Day of March, 2017

Michelle K. Lee
*Director of the United States Patent and Trademark Office*